(12) United States Patent
Mita et al.

(10) Patent No.: US 11,697,567 B2
(45) Date of Patent: Jul. 11, 2023

(54) WOUND BODY OF SHEET FOR SINTERING BONDING WITH BASE MATERIAL

(71) Applicant: NITTO DENKO CORPORATION, Ibaraki (JP)

(72) Inventors: Ryota Mita, Ibaraki (JP); Tomoaki Ichikawa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 628 days.

(21) Appl. No.: 16/818,398

(22) Filed: Mar. 13, 2020

(65) Prior Publication Data

US 2020/0290833 A1 Sep. 17, 2020

(30) Foreign Application Priority Data

Mar. 15, 2019 (JP) .................. 2019-047965

(51) Int. Cl.
 *B65H 18/02* (2006.01)
 *H01L 23/00* (2006.01)
 *B23K 35/02* (2006.01)

(52) U.S. Cl.
 CPC ......... *B65H 18/02* (2013.01); *B23K 35/0233* (2013.01); *H01L 24/26* (2013.01); *B65H 2511/13* (2013.01); *B65H 2511/14* (2013.01); *B65H 2701/361* (2013.01); *H01L 2224/04026* (2013.01)

(58) Field of Classification Search
None
See application file for complete search history.

(56) References Cited

U.S. PATENT DOCUMENTS

| 2012/0104134 | A1 | 5/2012 | Misumi |
| 2018/0056449 | A1* | 3/2018 | Zhu .................... B23K 35/3033 |
| 2018/0227507 | A1 | 8/2018 | Siminoff et al. |
| 2018/0273808 | A1 | 9/2018 | Kamakura et al. |

(Continued)

FOREIGN PATENT DOCUMENTS

| CN | 107709418 A | 2/2018 |
| EP | 3 358 607 A1 | 8/2018 |

(Continued)

OTHER PUBLICATIONS

F.Nimmo, EART162: Plantary Interiors, Slide 26: Plate Bending [retrieved on Jul. 28, 2020] (1 page total).

(Continued)

*Primary Examiner* — Daniel J. Schleis
(74) *Attorney, Agent, or Firm* — Sughrue Mion, PLLC

(57) ABSTRACT

To provide a wound body of a sheet for sintering bonding with a base material that realizes a satisfactory operational efficiency in a process of producing a semiconductor device comprising sintering bonding portions of semiconductor chips and that also has both a satisfactory storage stability and a high storage efficiency. A wound body 1 according to the present invention has a form in which a sheet for sintering bonding with a base material X is wound around a winding core 2 into a roll shape, the sheet for sintering bonding with a base material X having a laminated structure comprising: a base material 11; and a sheet for sintering bonding 10, comprising an electrically conductive metal containing sinterable particle and a binder component.

8 Claims, 5 Drawing Sheets

(56) References Cited

U.S. PATENT DOCUMENTS

| | | |
|---|---|---|
| 2019/0043824 A1 | 2/2019 | Sugo et al. |
| 2019/0184460 A1 | 6/2019 | Honda et al. |
| 2020/0048504 A1 | 2/2020 | Sugo et al. |

FOREIGN PATENT DOCUMENTS

| | | |
|---|---|---|
| EP | 3 358 609 A1 | 8/2018 |
| EP | 3 434 398 A1 | 1/2019 |
| EP | 3 509 092 A1 | 7/2019 |
| JP | 2010-126716 A | 6/2010 |
| JP | 2013-39580 A | 2/2013 |
| JP | 2014-111800 A | 6/2014 |
| JP | 2015-122432 A | 7/2015 |
| JP | 2018-37548 A | 3/2018 |
| WO | 2016/182663 A1 | 11/2016 |
| WO | 2018/042771 A1 | 3/2018 |
| WO | 2018/179796 A1 | 10/2018 |

OTHER PUBLICATIONS

Extended European Search Report dated Aug. 11, 2020, from the European Patent Office in application No. 20162360.0.
Notice of Reasons for Refusal dated Jul. 26, 2022, issued in Japanese Application No. 2019-047965.
First Office Action dated Oct. 21, 2022 issued by The State Intellectual Property Office of People's Republic of China in CN Application No. 202010171624.5.

* cited by examiner

WOUND BODY OF SHEET FOR SINTERING BONDING WITH BASE MATERIAL

TECHNICAL FIELD

The present invention relates to a wound body of a sheet for sintering bonding with a base material that can be used for producing semiconductor devices and the like.

BACKGROUND ART

In production of semiconductor devices, as a technique for die bonding a semiconductor chip to a supporting substrate, such as a lead frame or an insulating circuit substrate, while making an electrical connection with the side of the supporting substrate, a technique for forming a Au—Si eutectic alloy layer between the supporting substrate and the chip to realize a bonded state, or a technique for utilizing solder or an electrically conductive particle containing resin as a bonding material have been known.

Meanwhile, the spread of power semiconductor devices playing a role of controlling power supply has been remarkable in recent years. Power semiconductor devices often generate a large amount of heat due to a large amount of energization upon operation. Therefore, in production of power semiconductor devices, with respect to the technique for die bonding a semiconductor chip to a supporting substrate while making an electrical connection with the side of supporting substrate, it is desired to be able to realize a bonded state with high reliability even upon operation at high temperature. Such a demand is particularly strong in a power semiconductor device in which SiC or GaN is employed as a semiconductor material, attempting operation at a higher temperature. In order to meet such a demand, as a die bonding technique involving an electrical connection, a technology for using a composition for sintering bonding, containing a sinterable particle, a solvent and the like, has been proposed.

In the die bonding that is carried out using a sinterable particle containing material for sintering bonding, at first, a semiconductor chip is mounted onto a portion of the supporting substrate to which the chip is planned to be bonded via the material for sintering bonding under predetermined temperature and load conditions. Thereafter, a heating step is carried out under predetermined temperature and pressurization conditions such that volatilization of the solvent and the like in the material for sintering bonding occurs between the supporting substrate and the semiconductor chip thereon, and sintering between sinterable particles proceeds. Due to this, a sintered layer is formed between the supporting substrate and the semiconductor chip, and the semiconductor chip is mechanically bonded to the supporting substrate while making an electrical connection. Such a technique is described in, for example, the following Patent Literatures 1 and 2.

CITATION LIST

Patent Literature

Patent Literature 1
  Japanese Patent Laid-Open No. 2013-039580
Patent Literature 2
  Japanese Patent Laid-Open No. 2014-111800

SUMMARY OF INVENTION

Technical Problem

In a process of producing a semiconductor device in which die bonding is performed by sintering bonding, conventionally, a pasty, sinterable particle containing composition may be applied to every semiconductor chip. However, such a technique is not efficient.

On the other hand, in the process of producing a semiconductor device in which die bonding is performed by sintering bonding, in order to collectively supply a material for sintering bonding to a plurality of semiconductor chips, it is believed that the processes as described below are gone through, for example. At first, a plurality of semiconductor chips is arranged on a tape for processing having an adhesive face on one side or the adhesive face thereof. Next, a sheet for sintering bonding with a base material, which is a material for sintering bonding made into the form of a sheet, is pressed against the semiconductor chip array on the tape for processing, thereby laminating them. Next, while leaving the portions of the sheet for sintering bonding that have been pressure-bonded to the semiconductor chips on those semiconductor chips, separation of that sheet body is carried out. Through the lamination and the subsequent separation of that sheet body, transfer of the material for sintering bonding from the sheet body to each semiconductor chip is carried out, (that is, a small piece of the sheet for sintering bonding separated from the base material is transferred onto the semiconductor chip), and a semiconductor chip with a layer of the material for sintering bonding is thus obtained. According to such a technique, it is possible to collectively supply a material for sintering bonding to a plurality of semiconductor chips.

However, the sheet for sintering bonding with a base material mentioned above has a flat paper-like form, and therefore, upon the transfer onto the semiconductor chip, it is necessary to provide the sheet one by one, which presents a poor conveyability. In addition, for registration to the semiconductor chip array, it is necessary to define at least two directions, which is not preferable from the viewpoint of operational efficiency. Moreover, when the flat paper-like form is employed, the area exposed to the atmospheric air becomes larger, and such a sheet for sintering bonding is thus not preferable from the viewpoint of storage stability. Furthermore, the flat paper-like form causes a bulky sheet for sintering bonding upon storage and necessitates a large storing space, which is thus not preferable from the viewpoint of storage efficiency.

The present invention was thought out under the circumstances as described above, and an object of the present invention is to provide a wound body of a sheet for sintering bonding with a base material that realizes a satisfactory operational efficiency in the process of producing a semiconductor device comprising sintering bonding portions of semiconductor chips and that also has both a satisfactory storage stability and a high storage efficiency.

Solution to Problem

According to the first aspect of the present invention, a wound body is provided. This wound body has a form in which a sheet for sintering bonding with a base material is wound around a winding core into a roll, the sheet for sintering bonding with a base material having a laminated structure comprising: a base material; and a sheet for sintering bonding, comprising an electrically conductive metal containing sinterable particle and a binder component.

For example, the sheet for sintering bonding with a base material is used in the production process of a semiconductor device comprising sintering bonding portions of semiconductor chips, as follows. At first, the present sheet for sintering bonding with a base material is pressed against a plurality of semiconductor chips arranged on a tape for processing having an adhesive face on one side or the adhesive face thereof, thereby laminating them. Next, while leaving the portions of the sheet for sintering bonding with a base material that have been pressure-bonded to the semiconductor chips on those semiconductor chips, a separation operation of that sheet body is carried out. Through such lamination operation and subsequent separation operation, transfer of the material for sintering bonding from the sheet for sintering bonding to each semiconductor chip is carried out, and a layer of the material for sintering bonding, which is a small piece of the sheet for sintering bonding separated from the base material, occurs on the semiconductor chip (a transfer step). Next, the semiconductor chip with the layer of the material for sintering bonding is pressure-bonded to a substrate via that layer of the material for sintering bonding, and is fixed temporarily. Then, a sintered layer is formed through a heating process from the layer of the material for sintering bonding intervening between the temporarily fixed semiconductor chip and the substrate, and that semiconductor chip is sintering-bonded to the substrate. As described above, it is possible to sintering-bond a semiconductor chip to a substrate by using the sheet for sintering bonding with a base material, for example.

The present wound body has a form in which a sheet for sintering bonding with a base material is wound around a winding core into a roll shape, as mentioned above. When the sheet for sintering bonding with a base material employs a form of a wound body, transfer of the material for sintering bonding from the sheet for sintering bonding to each semiconductor chip can be carried out in succession upon the transfer step in the production of a semiconductor device. Specifically, the transfer step can be carried out successively, in which the sheet for sintering bonding with a base material having a certain length is drawn out from the present wound body such that the sheet for sintering bonding with a base material can cover semiconductor chips; transfer of the material for sintering bonding to the semiconductor chips is carried out; the sheet is cut, if necessary; and while new semiconductor chips are provided, the sheet for sintering bonding with a base material having a certain length is further drawn out, thereby carrying out transfer of the material for sintering bonding to the semiconductor chips. Accordingly, when compared to a sheet for sintering bonding with a base material having a flat paper-like form, which necessitates to be provided one by one in the transfer step, it can be said that the conveyability is more satisfactory. In addition, when compared to the fact that it is necessary to define at least two directions for registration to the semiconductor chip array, it can be said that the operational efficiency is more satisfactory. Moreover, the present wound body has a form of a roll shape, and therefore, compared to those having a flat paper-like form, the area exposed to the atmospheric air becomes smaller, which is preferable from the viewpoint of storage stability, and furthermore, the present wound body is not bulky upon storage, which is preferable from the viewpoint of storage efficiency.

In the present wound body, it is suitable for the outer diameter of the winding core and the thickness of the sheet for sintering bonding to satisfy the following formula from the viewpoint of suppressing separation of the base material and the sheet for sintering bonding in the sheet for sintering bonding with a base material due to the form in which the sheet for sintering bonding with a base material is wound around the winding core into a roll shape. In addition, this is also suitable from the viewpoint of suppressing cracks of the sheet for sintering bonding. [the outer diameter of the winding core (mm)]/[the thickness of the sheet for sintering bonding (mm)]$^2$≥3500.

In the present wound body, in the same way as described above, it is also suitable for the outer diameter of the winding core to be 30 to 260 mm from the viewpoint of suppressing separation of the base material and the sheet for sintering bonding in the sheet for sintering bonding with a base material due to the form in which the sheet for sintering bonding with a base material is wound around the winding core into a roll shape. In addition, this is also suitable from the viewpoint of suppressing cracks of the sheet for sintering bonding. Furthermore, when the outer diameter of the winding core is in the above range, there is a tendency that separation or cracks, which occur due to a small outer diameter of the winding core, are suppressed more. Moreover, the volume of the wound body does not become too large relative to the winding number, which is suitable from the viewpoint of storage efficiency or transportation efficiency.

In the present wound body, in the same way as described above, it is also suitable for the thickness of the sheet for sintering bonding to be 10 to 300 μm from the viewpoint of suppressing separation of the base material and the sheet for sintering bonding in the sheet for sintering bonding with a base material due to the form in which the sheet for sintering bonding with a base material is wound around the winding core into a roll shape. In addition, this is also suitable from the viewpoint of suppressing cracks of the sheet for sintering bonding. In particular, when the thickness of the sheet for sintering bonding is 10 μm or more, influence on the surface of the sheet due to the shape of the sinterable particle (occurrence of irregularities on the surface of the sheet, and the like) becomes smaller, and as a result, the bonding tends to be stabilized upon sintering semiconductor chips to the substrate.

Advantageous Effects of Invention

As described above, the present wound body is suited for realizing a satisfactory operational efficiency in the process of producing a semiconductor device comprising sintering bonding portions of semiconductor chips. In addition, the present wound body has both a satisfactory storage stability and a high storage efficiency.

DESCRIPTION OF EMBODIMENTS

Figure 1:
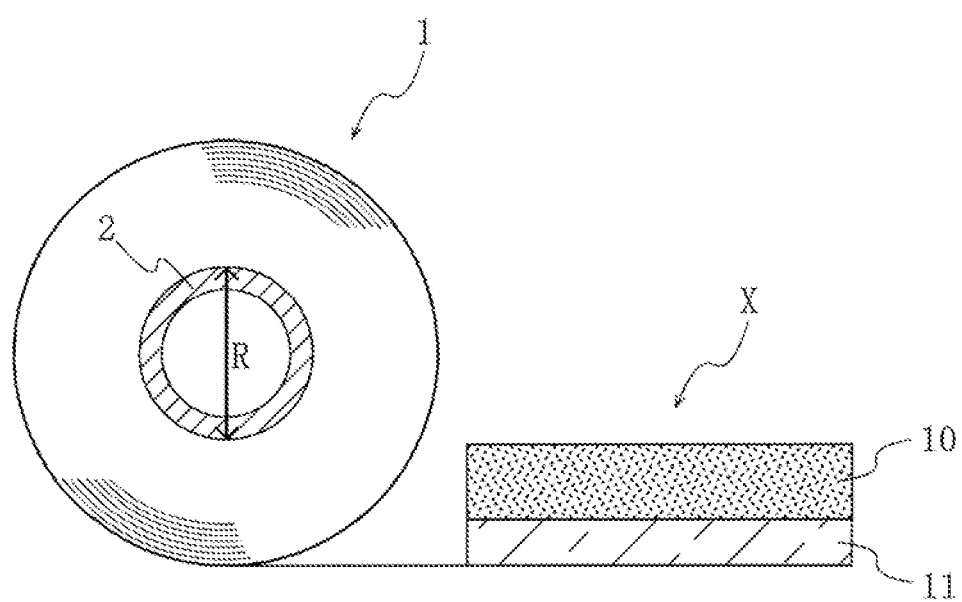
FIG. 1 is a partially enlarged schematic cross sectional drawing of a wound body of a sheet for sintering bonding with a base material according to one embodiment of the present invention.

FIG. 1 is a partial schematic cross sectional drawing of a wound body 1 of a sheet body X, which is a sheet for sintering bonding with a base material according to one embodiment of the present invention. Note that a part of a sheet for sintering bonding with a base material X is illustrated as an enlarged drawing for convenience sake. The sheet for sintering bonding with a base material X has a laminated structure comprising a base material 11 and a sheet for sintering bonding 10, and in such a laminated structure, it has a form of a roll in which the base material 11 is located closer to the outer diameter side than the sheet for sintering bonding 10. That is, in the present embodiment, the sheet for sintering bonding with a base material X is coiled around a winding core 2 in an aspect or direction in which the base material 11 is located closer to the outer diameter side than the sheet for sintering bonding 10 in the above laminated structure.

The base material 11 is an element that functions as a support in the sheet for sintering bonding with a base material X, and may be located closer to the inner diameter side of the wound body than the sheet for sintering bonding 10 or may be located closer to the outer diameter side of the wound body, but from the viewpoint of protecting the sheet for sintering bonding 10, it is preferable that the base material be located closer to the outer diameter side of the wound body. The base material 11 is, for example, a plastic base material, and as such a plastic base material, a plastic film can be suitably used. Examples of the constituent material for the plastic base material include, for example, polyolefins, polyesters, polyurethanes, polycarbonates, polyetheretherketones, polyimides, polyetherimides, polyamides, wholly aromatic polyamides, polyvinyl chlorides, polyvinylidene chlorides, polyphenyl sulfides, aramids, fluororesins, cellulosic resins, and silicone resins. Examples of the polyolefin include, for example, low density polyethylenes, linear low density polyethylenes, medium density polyethylenes, high density polyethylenes, very low density polyethylenes, random copolymerized polypropylenes, block copolymerized polypropylenes, homopolypropylenes, polybutenes, polymethylpentenes, ethylene-vinyl acetate copolymers, ionomer resins, ethylene-(meth)acrylic acid copolymers, ethylene-(meth)acrylate ester copolymers, ethylene-butene copolymers, and ethylene-hexene copolymers. Examples of the polyester include, for example, polyethylene terephthalates, polyethylene naphthalates, and polybutylene terephthalates. The base material 11 may be formed of one kind of material, or may be formed of two or more kinds of materials. The base material 11 may have a single layer structure, or may have a multilayer structure. When the base material 11 is formed of a plastic film, such a base material 11 may be a pressure-sensitive adhesive tape or pressure-sensitive adhesive sheet, such as a dicing tape, having a layer of a pressure-sensitive adhesive forming an adhesive face on the side of the sheet for sintering bonding. That layer of a pressure-sensitive adhesive may be a layer of an ultraviolet curable pressure-sensitive adhesive, which is cured by ultraviolet irradiation, thereby decreasing the adhesive strength.

The thickness of the base material 11 is not particularly limited, and for example, it is preferably 10 to 200 μm, more preferably 20 to 150 μm, and more preferably 30 to 100 μm.

The sheet for sintering bonding 10 is a composition for sintering bonding having the shape of a sheet, at least comprising an electrically conductive metal containing sinterable particle and a binder component, the composition being used for sintering-bonding the bonding objects therebetween. The sheet for sintering bonding 10 may have a predetermined planar view shape, such as a circular shape or a rectangular shape, on the base material 11. Alternatively, on a single base material 11, a plurality of sheets for sintering bonding 10 having a predetermined planar view shape may be provided. In addition, the sheet for sintering bonding 10 may have an aspect in which a plurality of sheets for sintering bonding is arranged on a base material 11 with a long length in the extension direction of the base material.

The sinterable particle in the sheet for sintering bonding 10 is a particle that contains an electrically conductive metallic element and can be sintered. Examples of the electrically conductive metallic element include, for example, gold, silver, copper, palladium, tin, and nickel. Examples of the constituent material for such a sinterable particle include, for example, gold, silver, copper, palladium, tin, nickel, and an alloy of two or more kinds of metals selected from the group thereof. Examples of the constituent material for the sinterable particle also include metal oxides, such as silver oxide, copper oxide, palladium oxide, and tin oxide. In addition, the sinterable particle may be a particle having a core shell structure. For example, the sinterable particle may be a particle with a core shell structure, having a core mainly composed of copper and a shell mainly composed of gold or silver and covering the core. In the present embodiment, the sinterable particle preferably comprises at least one selected from the group consisting of a silver particle, a copper particle, a silver oxide particle and a copper oxide particle. Such a configuration is preferable from the viewpoint of forming a rigid sintered layer between the bonding objects to be sintering-bonded using the sheet for sintering bonding 10. Moreover, from the viewpoint of achieving high electrical conductivity and high thermal conductivity in a sintered layer to be formed, a silver particle and a copper particle are preferable as the sinterable particle. In addition, from the viewpoint of oxidation resistance, a silver particle is easily handled and is thus preferable. For example, in sintering bonding of a semiconductor chip to a copper substrate with silver plate, when a sintering material containing a copper particle as the sinterable particle is used, it is necessary to carry out the sintering process under an inert environment such as under a nitrogen atmosphere; however, when a sintering material in which a silver particle acts as the sinterable particle is used, the sintering process can be properly conducted even in an air atmosphere.

The average particle diameter of the sinterable particle to be used is preferably 10000 nm or less, more preferably 3000 nm or less, more preferably 1000 nm or less, and more preferably 500 nm or less from the viewpoint of ensuring the flatness of the surface of the sheet for sintering bonding 10. With respect to the sinterable particle in the sheet for sintering bonding 10 or the composition for forming the sheet, from the viewpoint of realizing satisfactory dispersibility, the average particle diameter of the sinterable particle is preferably 1 nm or more, more preferably 10 nm or more, and more preferably 50 nm or more. The average particle diameter of the sinterable particle can be measured by carrying out observation using a scanning electron microscope (SEM).

In the sheet for sintering bonding 10, the content of the sinterable particle is not particularly limited, and for example, it is 60 to 99% by mass, preferably 65 to 98% by mass, and more preferably 70 to 97% by mass. When the content of the sinterable particle is within the above range, there is a tendency that cracks of the sheet for sintering bonding are suppressed more. In addition, the bonding tends to be stabilized more upon sintering semiconductor chips to the substrate. In particular, when the content of the sinterable particle is 60% by mass or more, a sufficient amount of the sinterable particle is included in the sheet for sintering bonding, and therefore, there is a tendency that the bonding is stabilized more upon the sintering. In addition, when the content of the sinterable particle is 99% by mass or less, a sufficient amount of the binder component can be included in the sheet for sintering bonding, and therefore, there is a tendency that cracks of the sheet for sintering bonding are suppressed more.

The binder component in the sheet for sintering bonding 10 may comprise a high molecular binder or a low molecular binder, and may further comprise an additional component such as a plasticizer. Among them, from the viewpoint of suppressing cracks of the sheet for sintering bonding upon making it into a wound body or from the viewpoint of suppressing separation of the base material and the sheet for sintering bonding, the binder component in the sheet for sintering bonding 10 preferably comprises a high molecular binder, and more preferably comprises a high molecular binder and a low molecular binder at the same time.

The high molecular binder in the sheet for sintering bonding is preferably a thermally decomposable high molecular binder. The thermally decomposable high molecular binder is a binder component that can be thermally decomposed during the heating process at high temperature for sintering bonding, and is an element that contributes to retention of the sheet shape of the sheet for sintering bonding 10 until the initiation of that heating process. In the present embodiment, from the viewpoint of securing a function of retaining the sheet shape, the thermally decomposable high molecular binder is a solid material at ordinary temperature (23° C.). Examples of such a thermally decomposable high molecular binder may include, for example, a polycarbonate resin and an acrylic resin. The sheet for sintering bonding 10 preferably comprises a polycarbonate resin and/or an acrylic resin as the high molecular binder or the thermally decomposable high molecular binder.

Examples of the above polycarbonate resin include, for example, aliphatic polycarbonates having a backbone of carboxylate ester groups (—O—CO—O—) not comprising an aromatic compound, such as a benzene ring, therebetween and formed of aliphatic chains, and aromatic polycarbonates having a backbone of carboxylate ester groups (—O—CO—O—) comprising an aromatic compound therebetween. Examples of the aliphatic polycarbonate include, for example, polyethylene carbonates and polypropylene carbonates. Examples of the aromatic polycarbonate include polycarbonates comprising a bisphenol A structure in the backbone thereof.

Examples of the above acrylic resin include, for example, polymers of an acrylate ester and/or a methacrylate ester having a linear or branched alkyl group having 4 to 18 carbon atoms. Hereinafter, "acrylic" and/or "methacrylic" are represented by "(meth)acrylic", and "acrylate" and/or "methacrylate" are represented by "(meth)acrylate". Examples of the alkyl group of the (meth)acrylate ester forming an acrylic resin as the thermally decomposable high molecular binder include, for example, a methyl group, an ethyl group, a propyl group, an isopropyl group, a n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, and an octadecyl group.

The above acrylic resin may be a polymer comprising a monomer unit derived from an additional monomer other than the above (meth)acrylate ester. Examples of such an additional monomer include, for example, carboxy group containing monomers, acid anhydride monomers, hydroxy group containing monomers, sulfonic acid group containing monomers, and phosphoric acid group containing monomers. Specifically, examples of the carboxy group containing monomer include, for example, acrylic acid, methacrylic acid, carboxyethyl acrylate, carboxypentyl acrylate, itaconic acid, maleic acid, fumaric acid, and crotonic acid. Examples of the acid anhydride monomer include, for example, maleic anhydride and itaconic anhydride. Examples of the hydroxy group containing monomer include, for example, 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and 4-(hydroxymethyl)cyclohexylmethyl (meth)acrylate. Examples of the sulfonic acid group containing monomer include, for example, styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid. Examples of the phosphoric acid group containing monomer include, for example, 2-hydroxyethylacryloyl phosphate.

The weight average molecular weight of the high molecular binder or the thermally decomposable high molecular binder contained in the sheet for sintering bonding 10 is preferably 10000 or more. The weight average molecular weight of the high molecular binder is defined to be a value obtained through measurement with gel permeation chromatography (GPC) and calculation in terms of polystyrene.

The content of the high molecular binder contained in the sheet for sintering bonding 10 is not particularly limited, and for example, it is preferably 0 to 20% by mass, more preferably 0.1 to 20% by mass, more preferably 0.5 to 18% by mass, and more preferably 1.0 to 15% by mass. When the content of the high molecular binder is within the above range, there is a tendency that cracks of the sheet for sintering bonding are suppressed more. In particular, when the content of the high molecular binder is 0.1% by mass or more, contribution of the high molecular binder to retention of the shape of the sheet for sintering bonding becomes larger, and the binding property between sinterable particles is improved, and therefore, there is a tendency that cracks of the sheet for sintering bonding are suppressed more. In addition, when the content of the high molecular binder is 20% by mass or less, a sufficient amount of the low molecular binder or the sinterable particle can be included in the sheet for sintering bonding, and therefore, there is a tendency that the adhesiveness between the base material and the sheet for sintering bonding is improved, and the bonding is also stabilized more upon the sintering.

The low molecular binder in the sheet for sintering bonding 10 is preferably a low boiling point binder. The low boiling point binder is a binder component having a boiling point lower than the thermal decomposition starting temperature of the high molecular binder such as a thermally decomposable high molecular binder. In the present embodiment, the low boiling point binder is defined to be liquid or semi-liquid, exhibiting a viscosity at 23° C. of $1 \times 10^5$ Pa·s or less, which is measured by using an apparatus for measuring dynamic viscoelasticity (trade name: "HAAKE MARS III", manufactured by Thermo Fisher Scientific K.K.). In the present viscosity measurement, 20 mmφ parallel plates are used as jigs, the gap between the plates is 100 μm, and the shear velocity in rotational shear is $1\ \text{s}^{-1}$.

Examples of the low boiling point binder mentioned above include, for example, terpene alcohols, alcohols excluding terpene alcohols, alkylene glycol alkyl ethers, and ethers excluding alkylene glycol alkyl ethers. Examples of the terpene alcohol include, for example, isobornyl cyclohexanol, citronellol, geraniol, nerol, carveol, and α-terpineol. Examples of the alcohol excluding terpene alcohols include, for example, pentanol, hexanol, heptanol, octanol, 1-decanol, ethylene glycol, diethylene glycol, propylene glycol, butylene glycol, and 2,4-diethyl-1,5-pentanediol. Examples of the alkylene glycol alkyl ether include, for example, ethylene glycol butyl ether, diethylene glycol methyl ether, diethylene glycol ethyl ether, diethylene glycol butyl ether, diethylene glycol isobutyl ether, diethylene glycol hexyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether. Examples of the ether excluding alkylene glycol alkyl ethers include, for example, ethylene glycol ethyl ether acetate, ethylene glycol butyl ether acetate, diethylene glycol ethyl ether acetate, diethylene glycol butyl ether acetate, and dipropylene glycol methyl ether acetate. As a component in the sheet for sintering bonding 10, one kind of low boiling point binder may be used, or two or more kinds of low boiling point binders may be used. The low boiling point binder in the sheet for sintering bonding 10 is preferably a terpene alcohol, and is more preferably isobornyl cyclohexanol from the viewpoint of stability at ordinary temperature.

The molecular weight of the low molecular binder is not particularly limited, and for example, it is 500 or less, preferably 450 or less, more preferably 400 or less, further preferably 350 or less, and particularly preferably 300 or less. In addition, the molecular weight of the low molecular binder is, for example, 50 or more, preferably 100 or more, more preferably 150 or more, and further preferably 200 or more.

The boiling point of the low boiling point binder is not particularly limited as long as it is lower than the thermal decomposition starting temperature of the high molecular binder such as a thermally decomposable high molecular binder, and for example, it is 500° C. or less, preferably 450° C. or less, more preferably 400° C. or less, and further preferably 350° C. or less. In addition, the boiling point of the low boiling point binder is, for example, 50° C. or more, preferably 100° C. or more, more preferably 150° C. or more, further preferably 200° C. or more, and particularly preferably 250° C. or more.

The content of the low molecular binder in the sheet for sintering bonding 10 is not particularly limited, and for example, it is preferably 0 to 50% by mass, more preferably 0.5 to 50% by mass, more preferably 1 to 30% by mass, more preferably 1.5 to 20% by mass, and more preferably 2 to 15% by mass. When the content of the low molecular binder is within the above range, there is a tendency that separation of the base material and the sheet for sintering bonding is suppressed more. In particular, when the content of the low molecular binder is 0.5% by mass or more, a sufficient amount of the low molecular binder is included in the sheet for sintering bonding, and therefore, there is a tendency that the adhesive strength between the base material and the sheet for sintering bonding is improved, and separation of the base material and the sheet for sintering bonding is suppressed more. In addition, when the content of the low molecular binder is 50% by mass or less, a sufficient amount of the high molecular binder or the sinterable particle can be included in the sheet for sintering bonding, and therefore, there is a tendency that cracks of the sheet for sintering bonding are suppressed more, and the bonding is also stabilized more upon the sintering.

When a high molecular binder and a low molecular binder are included in the sheet for sintering bonding 10 as the binder component, the content ratio thereof (mass ratio, high molecular binder/low molecular binder) is not particularly limited, and for example, it is preferably 1/20 to 10/1, more preferably 1/10 to 3/1, and more preferably 1/8 to 1/1. When the above ratio is 1/20 or more, contribution of the high molecular binder in the binder component to retention of the shape of the sheet for sintering bonding becomes larger, and the binding property between sinterable particles is improved, and therefore, there is a tendency that cracks of the sheet for sintering bonding are suppressed more. In addition, when the above ratio is 10/1 or less, the proportion of the low molecular binder in the binder component becomes larger, and therefore, there is a tendency that the adhesive strength between the base material and the sheet for sintering bonding is improved, and separation thereof is suppressed more. That is, when the content ratio thereof is within the above range, both advantages tend to be exhibited that cracks of the sheet for sintering bonding are suppressed more, and that separation of the base material and the sheet for sintering bonding is suppressed more.

The thickness of the sheet for sintering bonding 10 (the thickness at 23° C.) is not particularly limited, and for example, it is preferably 10 to 300 μm, more preferably 20 to 250 μm, and more preferably 30 to 200 μm. When the thickness of the sheet for sintering bonding 10 is within the above range, there is a tendency that the bendability is satisfactory, and cracks of the sheet for sintering bonding are suppressed more. In addition, the bonding tends to be stabilized more upon sintering semiconductor chips to the substrate. In particular, when the thickness of the sheet for sintering bonding is 10 μm or more, the amount of the material for sintering bonding to be transferred to the semiconductor chip is sufficient, and therefore, there is a tendency that the bonding is stabilized more upon the sintering. In addition, when the thickness of the sheet for sintering bonding is 300 μm or less, there is a tendency that the bendability of the sheet for sintering bonding is satisfactory, and cracks of the sheet for sintering bonding are suppressed more.

The sheet for sintering bonding 10 or the composition for sintering bonding forming this has a viscosity at 70° C. of, for example, $5 \times 10^3$ to $1 \times 10^7$ Pa·s, and preferably $1 \times 10^4$ to $1 \times 10^6$ Pa·s.

The sheet for sintering bonding 10 can be made by, for example, mixing the respective components mentioned above in a solvent to prepare a varnish, applying such a varnish on the base material 11 to form a coating film, and then drying that coating film. For the solvent for preparing a varnish, an organic solvent or an alcoholic solvent can be used.

The surface roughness of the sheet for sintering bonding 10 is not particularly limited, and for example, it is preferably 50 μm or less, more preferably 30 μm or less, and more preferably 20 μm or less. When the surface roughness is within the above range, the uniformity in the thickness direction of the surface of the sheet for sintering bonding is satisfied at a high level, and there is a tendency that the adhesiveness with the base material (for example, PET), which is the object to be adhered, is improved. In addition, there is a tendency that separation of the base material and the sheet for sintering bonding, as well as cracks accompanying the separation, is suppressed more. Note that the surface roughness of the sheet for sintering bonding 10 can be measured by using, for example, a stylus surface profilometer ("Dektak 8", manufactured by ULVAC, Inc.)

The ratio between the thickness of the sheet for sintering bonding and the thickness of the base material (the thickness of the sheet for sintering bonding (μm)/the thickness of the base material (μm)) is not particularly limited, and for example, it is preferably 0.5 to 3.5, more preferably 1.0 to 2.5, and more preferably 1.2 to 2.0. When that ratio is within the above range, the sheet for sintering bonding with a base material has a moderate hardness (softness), and therefore, upon transferring the sheet for sintering bonding to the semiconductor chip, there is a tendency that the followability of the sheet for sintering bonding to the semiconductor chip is improved, and the conveyability of the sheet for sintering bonding with a base material also becomes satisfactory.

In the present embodiment, the sheet for sintering bonding with a base material X is coiled around the winding core 2, and the outer diameter of the winding core 2, that is, the innermost diameter R of the wound body 1 is preferably 30 to 260 mm, more preferably 50 to 210 mm, and more preferably 70 to 160 mm. When the outer diameter of the winding core 2 is within the above range, due to the form in which the sheet for sintering bonding with a base material is wound around the winding core into a roll shape, there is a tendency that separation of the base material and the sheet for sintering bonding in the sheet for sintering bonding with a base material is suppressed more. In addition, there is also a tendency that cracks of the sheet for sintering bonding are suppressed more. In particular, when the outer diameter of the winding core 2 gets closer to the upper limit of the above range, the curvature becomes lower, and therefore, there is a tendency that cracks of the sheet for sintering bonding are suppressed more, and when the outer diameter of the winding core 2 gets closer to the lower limit, the winding number (the winding number of the sheet) becomes larger relative to the volume of the wound body (the total volume of the winding core and the wound sheet), and therefore, there is a tendency that the storage efficiency and the transportation efficiency become excellent.

Examples of the constituent material for the winding core 2 include, for example, plastic materials, paper materials, and metals (for example, iron core, SUS core, aluminum core and the like.) Examples of the plastic material for the winding core 2 include, for example, acrylonitrile-butadiene-styrene copolymers (ABS), polyethylenes, polypropylenes, ethylene-propylene copolymers, and ethylene-vinyl acetate copolymers.

In the present wound body, it is preferable that the outer diameter of the winding core and the thickness of the sheet for sintering bonding satisfy the following formula: [the outer diameter of the winding core (mm)]/[the thickness of the sheet for sintering bonding (mm)]$^2 \geq 3500$.

It is suitable for the value obtained from the above formula (the left side formula) to be 3500 or more from the viewpoint of suppressing separation of the base material and the sheet for sintering bonding in the sheet for sintering bonding with a base material due to the form in which the sheet for sintering bonding with a base material is wound around the winding core into a roll shape. In addition, this is also suitable from the viewpoint of suppressing cracks of the sheet for sintering bonding.

The present wound body can be made by coiling a sheet for sintering bonding with a base material having a long length around a winding core. The coiling may be carried out in an aspect or direction in which the base material is located closer to the inner diameter side than the sheet for sintering bonding, or may be carried out in an aspect or direction in which the base material is located closer to the outer diameter side than the sheet for sintering bonding.

For example, the present wound body is used in the production process of a semiconductor device, as follows. At first, while sending out the sheet for sintering bonding with a base material X from the wound body 1 at a predetermined velocity, the sending out is stopped, if necessary, at the time point where it reaches a certain length (for example, a length that can cover all of a plurality of semiconductor chips provided); transfer of the material for sintering bonding to the semiconductor chips is carried out; the sheet is cut, if necessary; and while new semiconductor chips are provided, the sheet for sintering bonding with a base material having a certain length is further drawn out, thereby carrying out transfer of the material for sintering bonding. By using the present wound body in such a manner, the transfer step can be carried out successively.

Figure 2A:
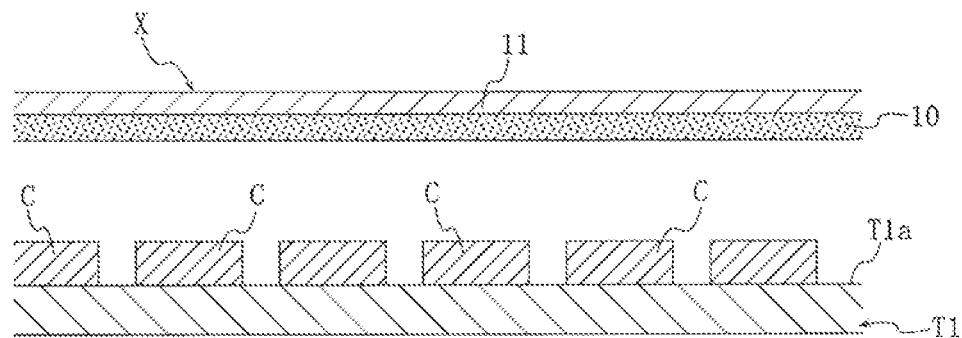
FIGS. 2(a)-(c) represent some steps in a method for producing a semiconductor device carried out by using the sheet for sintering bonding with a base material shown in FIG. 1.
Figure 2B:
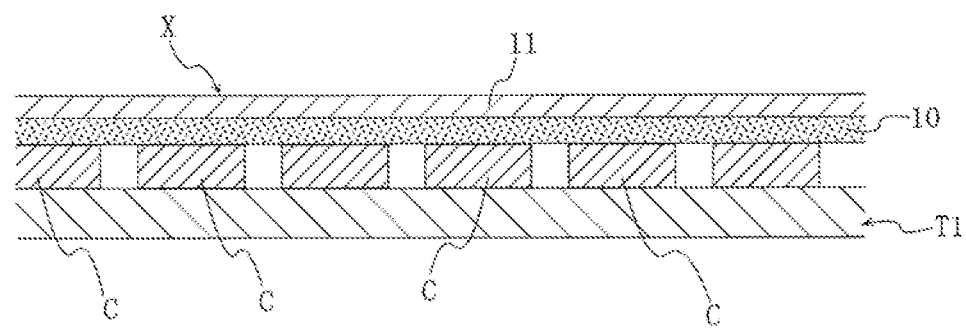

FIGS. 2(*a*)-(*c*) to FIGS. 6(*a*)-(*b*) represent some steps in a method for producing a semiconductor device carried out by using the sheet for sintering bonding with a base material X mentioned above. The present method is a method for producing a semiconductor device, such as a power semiconductor device comprising sintering bonding portions of semiconductor chips.

In the present method, at first, as shown in FIG. 2(*a*), the sheet for sintering bonding with a base material X having the sheet for sintering bonding 10 mentioned above, and a plurality of chips C are provided. Each of a plurality of chips C is a semiconductor chip in which a predetermined semiconductor element has already been fabricated. A plurality of chips C is arranged on an adhesive face T1*a* of a tape for processing T1, with a gap between the adjoining chips. Examples of the constituent material for forming the chip body of chips C include, for example, semiconductor materials for power semiconductor devices, such as silicon carbide (SiC) or gallium nitride (GaN). The thickness of the chip C is, for example, 20 to 1000 μm. In each chip C, an external electrode (not shown in the figure) has already been formed on the surface on the side to which the sheet for sintering bonding 10 is to be laminated (in FIGS. 2(*a*)-(*c*), the top face in the figure). The external electrode is, for example, a silver planar electrode, and the thickness thereof is, for example, 10 nm to 1000 nm. A silver planar electrode as the external electrode may be laminated and formed on a titanium thin film that has been formed on the surface of the semiconductor chip. The thickness of that titanium thin film is, for example, 10 nm to 1000 nm. These silver planar electrode and titanium thin film can be formed through, for example, a vapor deposition method. In addition, on the other face of each chip C (in FIGS. 2(*a*)-(*c*), the bottom face in the figure), another electrode pad or the like (not shown in the figure) has been formed, if necessary.

Figure 2C:
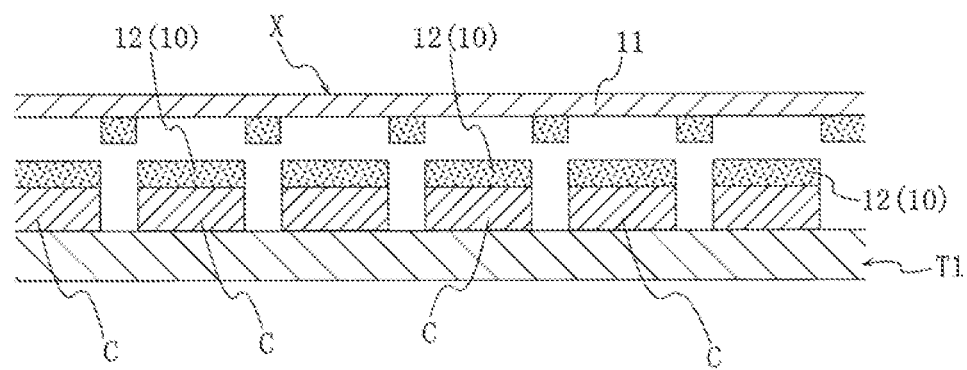

In the present method for producing a semiconductor device, next, a transfer step is carried out. In the transfer step, at first, as shown in FIG. 2(*b*), the side of the sheet for sintering bonding 10 of the sheet for sintering bonding with a base material X is pressure-bonded against a plurality of chips C on the tape for processing T1, thereby laminating them. Examples of the pressing means for the lamination include, for example, a pressure roller. The lamination temperature is, for example, in the range from room temperature to 200° C., and preferably 50 to 100° C. The load for the lamination is, for example, 0.01 to 10 MPa. After the lamination, as shown in FIG. 2(c), while leaving a part of the sheet for sintering bonding 10 on the side of the chip C, a separation operation of the base material 11 is carried out. Through such lamination operation and subsequent separation operation, transfer of the material for sintering bonding from the sheet for sintering bonding 10 to each chip C is carried out, and a layer of the material for sintering bonding 12, which is a small piece of the sheet for sintering bonding cut apart from the surroundings, occurs on the chip C. In the present step, the material for sintering bonding can be collectively supplied to every chip C.

Figure 3:
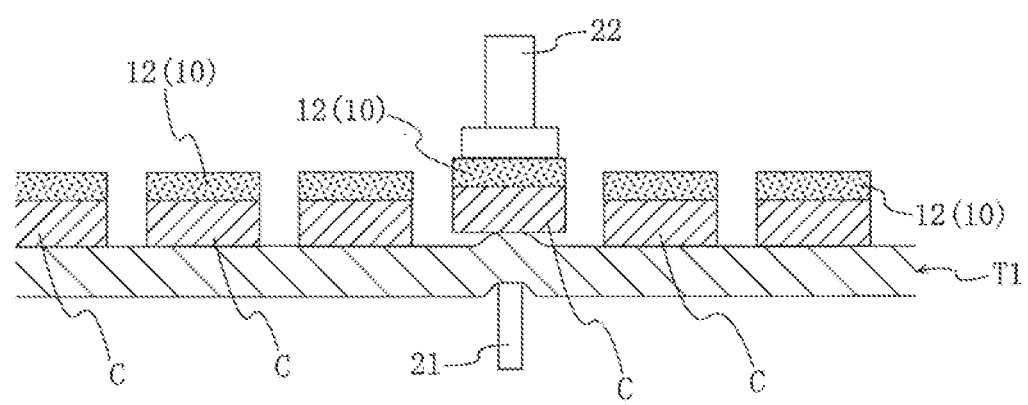
FIG. 3 represents a step subsequent to the step shown in FIGS. 2(a)-(c).

In the present method of producing a semiconductor device, next, as shown in FIG. 3, the chip C is picked up from the tape for processing T1 along with the part in the sheet for sintering bonding 10 that has been closely adhered to the chip C, thereby obtaining a chip C accompanied by the layer of the material for sintering bonding 12 (a picking up step). In the picking up step of the present embodiment, specifically, the chip C to be picked up is pushed up via the tape for processing T1 by raising a pin member 21 of a picking up mechanism at the lower side of the tape for processing T1 in the figure. After such pushing up, the chip C is adsorbed to and retained by an adsorption collet 22 through an adsorptive action to the side of the layer of the material for sintering bonding 12. As such, the picking up of the chip C with the layer of the material for sintering bonding 12 can be carried out.

Figure 4:
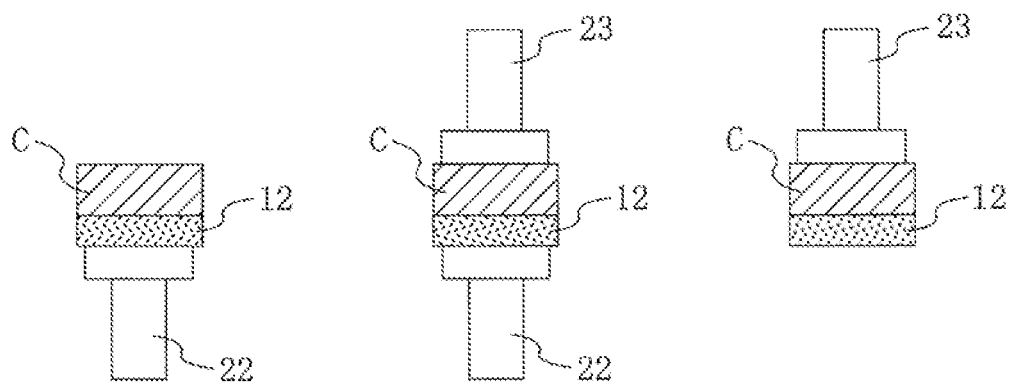
FIG. 4 represents a step subsequent to the step shown in FIG. 3.

In the present embodiment, next, as shown in FIG. 4, the chip C with the layer of the material for sintering bonding is delivered from the adsorption collet 22 that has picked up the chip C to another adsorption collet 23. The adsorption collet 23 retains the chip C through an adsorptive action to the side of the chip of the chip C with the layer of the material for sintering bonding.

Figure 5A:
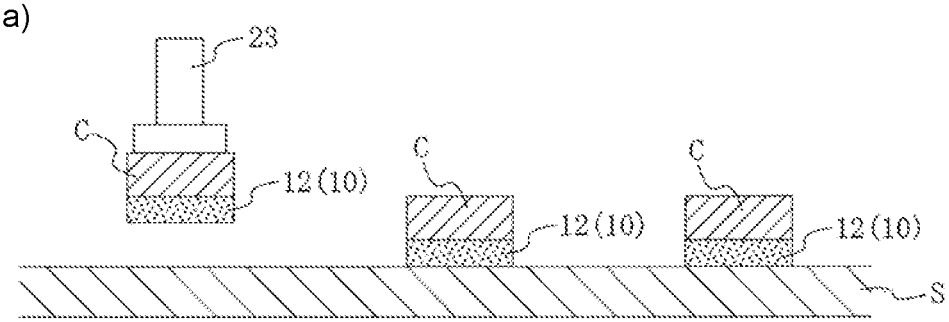
FIGS. 5(a)-(b) represent a step subsequent to the step shown in FIG. 4.

Next, as shown in FIG. 5(a), the chip C with the layer of the material for sintering bonding is pressure-bonded to a supporting substrate S via that layer of the material for sintering bonding 12, and is fixed temporarily (a temporary fixation step). Specifically, the chip C with the layer of the material for sintering bonding is pressed against the supporting substrate S via that layer of the material for sintering bonding 12 by, for example, using a chip mounter, and is fixed temporarily. Examples of the supporting substrate S include, for example, an insulating circuit substrate accompanied by a wiring such as a copper wiring on the surface thereof, and a lead frame. The portion of the supporting substrate S, on which the chip is mounted, may be the bare surface of a copper wiring or a lead frame, or may be the surface of a plated film formed on the bare surface. Examples of such a plated film include, for example, a gold plated film, a silver plated film, a nickel plated film, a palladium plated film, and a platinum plated film. In the present step, the temperature conditions for the temporary fixation are, for example, in the range from room temperature to 300° C., the load with respect to the pressing is, for example, 0.01 to 50 MPa, and the bonding time is, for example, 0.01 to 300 seconds.

Figure 5B:
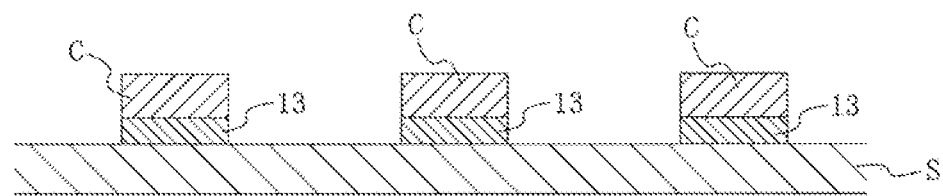

Next, as shown in FIG. 5(b), a sintered layer 13 is formed through a heating process from the layer of the material for sintering bonding 12 intervening between the temporarily fixed chip C and the supporting substrate S, and the chip C is sintering-bonded to the supporting substrate S (a sintering bonding step). Specifically, by going through a predetermined heating process at high temperature, the low molecular binder in the layer of the material for sintering bonding 12 is volatilized between the supporting substrate S and the chip C, and all of or a part of the high molecular binder is thermally decomposed and vaporized, if necessary, and then, the electrically conductive metal of the sinterable particle is sintered. Due to this, the sintered layer 13 is formed between the supporting substrate S and the chip C, and the chip C is bonded to the supporting substrate S while making an electrical connection with the side of supporting substrate S. In the present step, the temperature conditions for the sintering bonding are, for example, in the range of 150 to 400° C. The pressure for the sintering bonding is, for example, 60 MPa or less. In addition, the bonding time of the sintering bonding is, for example, 0.3 to 300 minutes. For example, within the range of these conditions, the temperature profile and the pressure profile for performing the sintering bonding step are appropriately set. The sintering bonding step as described above can be carried out by using an apparatus that can carry out heating and pressurization at the same time. Examples of such an apparatus include, for example, a flip chip bonder and a parallel plate pressing machine. In addition, from the viewpoint of preventing oxidation of the metal that is involved in the sintering bonding, it is preferable that the present step be carried out under a nitrogen atmosphere, under reduced pressure, or under a reducing gas atmosphere.

Figure 6A:
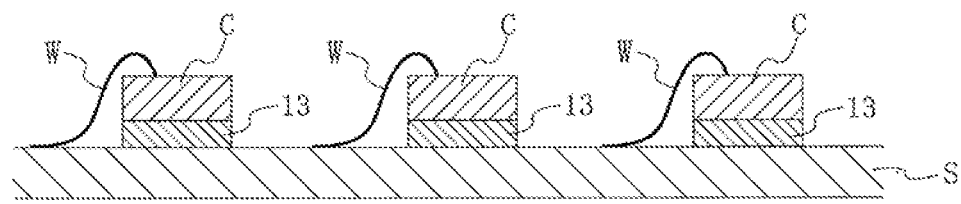
FIGS. 6(a)-(b) represent a step subsequent to the step shown in FIGS. 5(a)-(b).

In the present method of producing a semiconductor device, next, as shown in FIG. 6(a), an electrode part (not shown in the figure) of the chip C and a terminal part (not shown in the figure) that the supporting substrate S has are electrically connected via a bonding wire W, if necessary (a wire bonding step). The wire connection between the electrode part of the chip C or the terminal part of the supporting substrate S and the bonding wire W is realized through, for example, ultrasonic welding involving heating. As the bonding wire W, for example, a gold wire, an aluminum wire, or a copper wire can be used. The wire heating temperature in the wire bonding is, for example, 80 to 250° C. In addition, the heating time thereof is, for example, a few seconds to a few minutes.

Figure 6B:
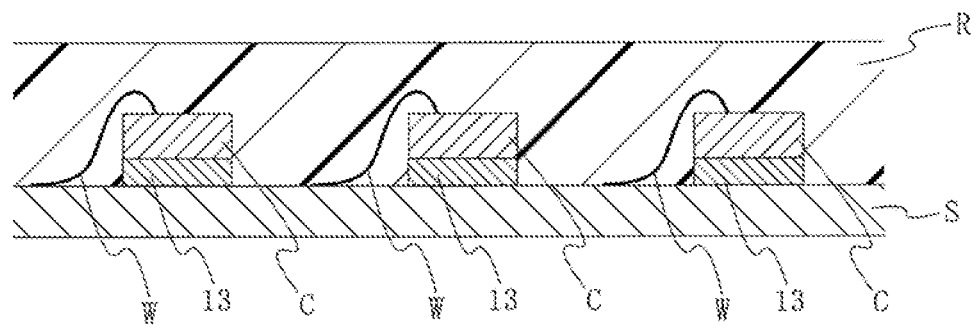

Next, as shown in FIG. 6(b), a sealing resin R is formed for protecting the chip C and the bonding wire W on the supporting substrate S (a sealing step). In the present step, for example, the sealing resin R is formed through a transfer mold technology, which is carried out by using a metal mold. As the constituent material for the sealing resin R, for example, an epoxy resin can be used. In the present step, the heating temperature for forming the sealing resin R is, for example 165 to 185° C., and the heating time is, for example, 60 seconds to a few minutes. When curing of the sealing resin R does not proceed sufficiently in the present sealing step, after the present step, a subsequent curing step is carried out for completely curing the sealing resin R.

As described above, a semiconductor device comprising sintering bonding portions of semiconductor chips can be produced. In addition, the sheet for sintering bonding 10 is suited for being made with a good operational efficiency and is also suited for realizing a satisfactory operational efficiency in the sintering process in the process of producing a semiconductor device comprising sintering bonding portions of semiconductor chips.

The binder component of the sheet for sintering bonding 10 preferably comprises a thermally decomposable high molecular binder, as mentioned above. According to such a configuration, at a temperature for the temporary fixation mentioned above, for example, at 70° C., and in the temperature range close thereto, by utilizing the viscoelasticity of the thermally decomposable high molecular binder, the cohesive strength of the sheet for sintering bonding 10 or the layer of the material for sintering bonding 12 derived therefrom is likely to be ensured, and accordingly, the adhesive strength of the sheet for sintering bonding 10 or the layer of the material for sintering bonding 12 is likely to be ensured. As such, the present configuration is suitable from the viewpoint of, upon or after pressure-bonding bonding objects in a state where the layer of the material for sintering bonding 12 derived from the sheet for sintering bonding 10 intervenes between the bonding objects, suppressing occurrence of position aberration in these bonding objects.

The weight average molecular weight of the high molecular binder, such as a thermally decomposable high molecular binder, in the sheet for sintering bonding 10 is preferably 10000 or more, as mentioned above. Such a configuration is suitable from the viewpoint of ensuring the cohesive strength or adhesive strength of the sheet for sintering bonding 10 or the layer of the material for sintering bonding 12 derived therefrom by utilizing the viscoelasticity of the high molecular binder.

The high molecular binder, such as a thermally decomposable high molecular binder, in the sheet for sintering bonding 10 preferably comprises a polycarbonate resin and/or an acrylic resin, as mentioned above. As mentioned above, in the process of using the sheet for sintering bonding 10 to realize sintering bonding, heating at high temperature for sintering bonding is carried out in a state where the bonding objects are temporarily fixed therebetween with the layer of the material for sintering bonding 12 derived from the sheet for sintering bonding 10. When the heating at high temperature for sintering bonding is carried out at, for example, 300° C. and in the temperature range including the vicinity thereof, a polycarbonate resin and an acrylic resin are easily provided as a high molecular binder that is decomposed and vaporized at a temperature of approximately 300° C. Accordingly, the present configuration is suitable from the viewpoint of reducing an organic residue in a sintered layer 13 formed between the bonding objects to be sintering-bonded using the sheet for sintering bonding 10. As the amount of the organic residue in the sintered layer 13 becomes smaller, that sintered layer 13 tends to be more rigid, and accordingly, high reliability for bonding is likely to be obtained in that sintered layer 13.

The low molecular binder in the sheet for sintering bonding 10 comprises a low boiling point binder having a boiling point lower than the thermal decomposition starting temperature of the high molecular binder, as mentioned above. Such a configuration is suited for ensuring satisfactory tackiness in the sheet for sintering bonding 10, and is therefore suited for ensuring satisfactory adhesiveness to other members such as the chip C and the base material 11. As such, the present configuration is suitable from the viewpoint of, upon or after pressure-bonding bonding objects in a state where the layer of the material for sintering bonding 12 derived from the sheet for sintering bonding 10 intervenes between the bonding objects, suppressing occurrence of position aberration in these bonding objects.

EXAMPLES

Example 1

By using a hybrid mixer (trade name: "HM-500", manufactured by Keyence Corporation) at its stirring mode, 56.51 parts by mass of a silver particle as a sinterable particle $P_1$, 0.82 parts by mass of a polycarbonate resin as a high molecular binder (a thermally decomposable high molecular binder) (trade name: "QPAC 40", the weight average molecular weight is 150000, solid at ordinary temperature, manufactured by Empower Materials), 3.29 parts by mass of isobornyl cyclohexanol as a low molecular binder (a low boiling point binder) (trade name: "Terusolve MTPH", liquid at ordinary temperature, manufactured by NIPPON TERPENE CHEMICALS, INC.), and 39.38 parts by mass of methyl ethyl ketone as a solvent were mixed to prepare a varnish. The stirring time was set to be 3 minutes. The above silver particle as the sinterable particle $P_1$ comprises the first silver particle (the average particle diameter: 60 nm, manufactured by DOWA Electronics Materials Co., Ltd.) and the second silver particle (the average particle diameter: 1100 nm, manufactured by MITSUI MINING & SMELTING CO., LTD.) at a mass ratio of 9:1. Then, the obtained varnish was applied on a mold release film as a base material (trade name: "MRA 38", manufactured by Mitsubishi Chemical Corporation, thickness: 38 μm), and subsequently dried to form a sheet for sintering bonding with a thickness of 200 μm. The drying temperature was set to be 110° C., and the drying time was set to be 3 minutes. In the sheet for sintering bonding, the content of the sinterable particle is 93.2% by mass. As described above, the sheet for sintering bonding that contains the sinterable particle, the high molecular binder and the low molecular binder and that is laminated on the base material (the sheet for sintering bonding with a base material) was made. The composition pertaining to the sheet for sintering bonding with a base material of Example 1 is reported in Table 1 (The same applies to Examples and Comparative Examples described below. In addition, in Table 1, the unit of each numerical value representing the composition is a relative "part by mass").

Example 2

A sheet for sintering bonding with a base material was made in the same manner as Example 1 except that the amount of the sinterable particle $P_1$ to be compounded was changed to 55.78 parts by mass; the amount of the polycarbonate resin (trade name: "QPAC 40", manufactured by Empower Materials) to be compounded was changed to 4.72 parts by mass; isobornyl cyclohexanol (trade name: "Terusolve MTPH", manufactured by NIPPON TERPENE CHEMICALS, INC.) was not used; and the amount of methyl ethyl ketone to be used was changed to 39.5 parts by mass. With respect to the sheet for sintering bonding of the present Example, the content of the sinterable particle is 92.2% by mass, and the thickness is 200 μm.

Example 3

A sheet for sintering bonding with a base material was made in the same manner as Example 1 except that the amount of the sinterable particle $P_1$ to be compounded was changed to 56.98 parts by mass; the amount of the polycarbonate resin (trade name: "QPAC 40", manufactured by Empower Materials) to be compounded was changed to 0.75 parts by mass; the amount of isobornyl cyclohexanol (trade name: "Terusolve MTPH", manufactured by NIPPON TERPENE CHEMICALS, INC.) to be compounded was changed to 2.98 parts by mass; and the amount of methyl ethyl ketone to be used was changed to 39.29 parts by mass. With respect to the sheet for sintering bonding of the present Example, the content of the sinterable particle is 93.9% by mass, and the thickness is 200 μm.

Example 4

A sheet for sintering bonding with a base material was made in the same manner as Example 1 except that 63.36 parts by mass of a copper particle as a sinterable particle $P_2$ (the average particle diameter: 200 nm, manufactured by MITSUI MINING & SMELTING CO., LTD.) was used instead of the sinterable particle $P_1$; the amount of the polycarbonate resin (trade name: "QPAC 40", manufactured by Empower Materials) to be compounded was changed to 5.43 parts by mass; the amount of isobornyl cyclohexanol (trade name: "Terusolve MTPH", manufactured by NIPPON TERPENE CHEMICALS, INC.) to be compounded was changed to 6.11 parts by mass; and the amount of methyl ethyl ketone to be used was changed to 25.1 parts by mass. With respect to the sheet for sintering bonding of the present Example, the content of the sinterable particle is 84.6% by mass, and the thickness is 200 μm.

Example 5

A sheet for sintering bonding with a base material was made in the same manner as Example 1 except that the amount of the sinterable particle $P_1$ to be compounded was changed to 56.69 parts by mass; the polycarbonate resin (trade name: "QPAC 40", manufactured by Empower Materials) was not used; the amount of isobornyl cyclohexanol (trade name: "Terusolve MTPH", manufactured by NIPPON TERPENE CHEMICALS, INC.) to be compounded was changed to 3.98 parts by mass; and the amount of methyl ethyl ketone to be used was changed to 39.33 parts by mass. With respect to the sheet for sintering bonding of the present Example, the content of the sinterable particle is 93.4% by mass, and the thickness is 200 μm.

Comparative Example 1

A sheet for sintering bonding with a base material was made in the same manner as Example 1 except that the amount of the sinterable particle $P_1$ to be compounded was changed to 56.69 parts by mass; the polycarbonate resin (trade name: "QPAC 40", manufactured by Empower Materials) and isobornyl cyclohexanol (trade name: "Terusolve MTPH", manufactured by NIPPON TERPENE CHEMICALS, INC.) were not used; and the amount of methyl ethyl ketone to be used was changed to 43.31 parts by mass. With respect to the sheet for sintering bonding of Comparative Example 1, the content of the sinterable particle is 100% by mass, and the thickness is 200 μm.

(Evaluation of Flexibility)

A wound body was made at room temperature (23° C.) by laying the sheet for sintering bonding with a base material formed into a strip shape with a thickness of 238 μm (the thickness of the sheet for sintering bonding was 200 μm) by a width of 10 mm by a length of 100 mm along a cylindrical winding core (made of an ABS resin, the outer diameter: 6 inches) such that the width direction of the sheet runs parallel to the winding core, and coiling the sheet three rounds such that the base material is closer to the inner diameter side. After that, the sheet for sintering bonding with a base material was removed from the winding core, and the flexibility was evaluated in accordance with the following criteria:

○: the sheet for sintering bonding was not separated from the base material, and no crack was found in the sheet for sintering bonding; and x: the sheet for sintering bonding was separated from the base material, or cracks were found in the sheet for sintering bonding.

(Separability from Base Material)

On the sheet for sintering bonding, a 180 degree peel test (the tensile velocity: 10 mm/sec, the separating temperature: 23° C.) was carried out by fixing the base material of the sheet for sintering bonding with a base material formed into a strip shape with a thickness of 238 μm (the thickness of the sheet for sintering bonding was 200 μm) by a width of 10 mm by a length of 100 mm and using a precision universal testing machine (Autograph AGS-J, manufactured by Shimadzu Corporation), and the separability from the base material was evaluated in accordance with the following criteria:

○: the sheet for sintering bonding was separated from the base material with no problem;

Δ: some stickiness was experienced upon separating the sheet for sintering bonding from the base material; and x: the sheet for sintering bonding was separated from the base material, or cracks were found in the sheet for sintering bonding.

TABLE 11

| | | Example 1 | Example 2 | Example 3 | Example 4 | Example 5 | Comparative Example 1 |
|---|---|---|---|---|---|---|---|
| Sinterable particle | $P_1$ (silver particle) | 56.51 | 55.78 | 56.98 | — | 56.69 | 56.69 |
| | $P_2$ (copper particle) | — | — | — | 63.36 | — | — |
| High molecular binder | Polycarbonate resin | 0.82 | 4.72 | 0.75 | 5.43 | — | — |
| Low molecular binder | Isobornyl cyclohexanol | 3.29 | — | 2.98 | 6.11 | 3.98 | — |
| Solvent used | Methyl ethyl ketone | 39.38 | 39.5 | 39.29 | 25.1 | 39.33 | 43.31 |
| Thickness of sheet for sintering bonding (μm) | | 200 | 200 | 200 | 200 | 200 | 200 |
| Outer diameter of winding core (mm) | | 152.4 | 152.4 | 152.4 | 152.4 | 152.4 | 152.4 |
| [Outer diameter of winding core (mm)]/[thickness of sheet for sintering bonding (mm)]^2 | | 3810 | 3810 | 3810 | 3810 | 3810 | 3810 |
| Evaluation of flexibility | | ○ | ○ | ○ | ○ | ○ | x |
| Separability from base material | | ○ | ○ | ○ | ○ | Δ | x |

As a summary of the above, the configuration of the present invention and variations thereof will be enumerated as clauses below.

[Clause 1]

A wound body having a form in which a sheet for sintering bonding with a base material is wound around a winding core into a roll shape, the sheet for sintering bonding with a base material having a laminated structure comprising:

a base material; and a sheet for sintering bonding, comprising an electrically conductive metal containing sinterable particle and a binder component.

[Clause 2]

The wound body according to clause 1, wherein an outer diameter of the winding core and a thickness of the sheet for sintering bonding satisfy the following formula: [the outer diameter of the winding core (mm)]/[the thickness of the sheet for sintering bonding (mm)]$^2$≥3500 or 6000.

[Clause 3]

The wound body according to clause 1 or 2, wherein an outer diameter of the winding core is 30 to 260 mm, 50 to 210 mm, or 70 to 160 mm.

[Clause 4]

The wound body according to any one of clauses 1 to 3, wherein a thickness of the sheet for sintering bonding is 10 to 300 μm, 20 to 250 μm, or 30 to 200 μm.

[Clause 5]

The wound body according to any one of clauses 1 to 4, wherein a ratio between a thickness of the sheet for sintering bonding and a thickness of the base material (the thickness of the sheet for sintering bonding (μm)/the thickness of the base material (μm)) is 0.5 to 3.5, 1.0 to 2.5, or 1.2 to 2.0.

[Clause 6]

The wound body according to any one of clauses 1 to 5, wherein a surface roughness of the sheet for sintering bonding is 50 μm or less, 30 μm or less, or 20 μm or less.

[Clause 7]

The wound body according to any one of clauses 1 to 6, wherein the binder component comprises a high molecular binder and/or a low molecular binder.

[Clause 8]

The wound body according to clause 7, wherein a weight average molecular weight of the high molecular binder is 10000 or more.

[Clause 9]

The wound body according to clause 7 or 8, wherein the high molecular binder comprises a polycarbonate resin and/or an acrylic resin.

[Clause 10]

The wound body according to any one of clauses 7 to 9, wherein the low molecular binder has a boiling point lower than a thermal decomposition starting temperature of the high molecular binder.

[Clause 11]

The wound body according to any one of clauses 1 to 10, wherein the sinterable particle comprises at least one selected from the group consisting of a silver particle, a copper particle, a silver oxide particle and a copper oxide particle.

[Clause 12]

The wound body according to any one of clauses 1 to 11, wherein a content of the sinterable particle is 60 to 99% by mass, 65 to 98% by mass, or 70 to 97% by mass.

[Clause 13]

The wound body according to any one of clauses 1 to 12, wherein the sheet for sintering bonding with a base material is coiled around the winding core in a direction in which the base material is located closer to an inner diameter side or an outer diameter side than the sheet for sintering bonding.

[Clause 14]

The wound body according to any one of clauses 1 to 13, wherein a plurality of sheets for sintering bonding with a predetermined planar view shape (for example, a circular shape or a rectangular shape) is provided on the base material.

[Clause 15]

The wound body according to any one of clauses 1 to 14, wherein a plurality of sheets for sintering bonding is arranged on a base material with a long length in an extension direction of the base material.

REFERENCE SIGNS LIST

X Sheet for sintering bonding with a base material
1 Wound body
2 Winding core
10 Sheet for sintering bonding
11 Base material
12 Layer of material for sintering bonding
13 Sintered layer
T1 Tape for processing
C Chip (semiconductor chip)
S Supporting substrate (substrate)
W Bonding wire

The invention claimed is:

1. A wound body having a form in which
a sheet for sintering bonding with a base material is wound around a winding core into a roll,
the sheet for sintering bonding with a base material having a laminated structure comprising:
a base material; and
a sheet for sintering bonding, comprising:
an electrically conductive metal containing sinterable particle; and
a binder component,
wherein an outer diameter of the winding core and a thickness of the sheet for sintering bonding satisfy the following formula:

$$[\text{the outer diameter of the winding core (mm)}]/[\text{the thickness of the sheet for sintering bonding (mm)}]^2 \geq 3500.$$

2. The wound body according to claim 1,
wherein the binder component comprises a high molecular binder and/or a low molecular binder,
the high molecular binder comprises a thermally decomposable high molecular binder, and
the low molecular binder comprises at least one terpene alcohol.

3. The wound body according to claim 1,
wherein the outer diameter of the winding core is 30 to 260 mm.

4. The wound body according to claim 2,
wherein the outer diameter of the winding core is 30 to 260 mm.

5. The wound body according to claim 1,
wherein the thickness of the sheet for sintering bonding is 10 to 300 μm.

6. The wound body according to claim 2,
wherein the thickness of the sheet for sintering bonding is 10 to 300 μm.

7. The wound body according to claim 3, wherein the thickness of the sheet for sintering bonding is 10 to 300 μm.

8. The wound body according to claim 4, wherein the thickness of the sheet for sintering bonding is 10 to 300 μm.

\* \* \* \* \*